(12) United States Patent
Xiao

(10) Patent No.: US 10,347,833 B2
(45) Date of Patent: Jul. 9, 2019

(54) RESISTIVE RANDOM ACCESS MEMORY AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Lihong Xiao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/263,918

(22) Filed: Sep. 13, 2016

(65) Prior Publication Data
US 2017/0092854 A1     Mar. 30, 2017

(30) Foreign Application Priority Data

Sep. 29, 2015   (CN) .......................... 2015 1 0631712

(51) Int. Cl.
*H01L 45/00*     (2006.01)
(52) U.S. Cl.
CPC .......... *H01L 45/1246* (2013.01); *H01L 45/04* (2013.01); *H01L 45/085* (2013.01);
(Continued)

(58) Field of Classification Search
CPC ... H01L 45/1233; H01L 45/146; H01L 45/08; H01L 45/145; H01L 27/2409
See application file for complete search history.

(56) References Cited

U.S. PATENT DOCUMENTS 5,429,995 A *  7/1995  Nishiyama ........ H01L 21/02131
                                                  257/758
6,429,128 B1    8/2002  Besser et al.
(Continued)

FOREIGN PATENT DOCUMENTS

| CN | 102468437 A | 5/2012 |
| CN | 104051277 A | 9/2014 |
| DE | 3032566 A1  | 5/1981 |

OTHER PUBLICATIONS

Lee F M et al "A Novel Conducting Bridge Resistive Memory Using a Semiconducting Dynamic E-field Moderating Layer" 2013 Symposium on VLSI Technology, Jun. 11-13, 2013, Kyoto, Japan.
(Continued)

*Primary Examiner* — Tony Tran
(74) *Attorney, Agent, or Firm* — Anova Law Group, PLLC

(57) ABSTRACT

The present disclosure provides resistive random access memory and fabrication methods thereof. An exemplary fabrication method of the resistive random access memory includes providing a substrate; forming a bottom electrode on the substrate; forming a resistance switching layer on the bottom electrode; forming a barrier on the resistance switching layer; and forming a top electrode on the barrier layer. The barrier is used to prevent atoms in the top electrode from diffusing into the resistance switching layer.

16 Claims, 5 Drawing Sheets

(52) U.S. Cl.
CPC .......... *H01L 45/12* (2013.01); *H01L 45/1233* (2013.01); *H01L 45/1266* (2013.01); *H01L 45/148* (2013.01); *H01L 45/16* (2013.01); *H01L 45/1616* (2013.01); *H01L 45/1641* (2013.01)

(56) References Cited

U.S. PATENT DOCUMENTS

| | | |
|---|---|---|
| 8,686,389 B1 | 4/2014 | Wang et al. |
| 2009/0020740 A1 | 1/2009 | Chien et al. |
| 2011/0236600 A1 | 9/2011 | Fox et al. |
| 2012/0043518 A1* | 2/2012 | Cheng .................. H01L 45/085 257/4 |
| 2012/0211719 A1 | 8/2012 | Haimoto et al. |
| 2013/0334483 A1 | 12/2013 | Ramaswamy et al. |
| 2014/0175355 A1 | 6/2014 | Wang et al. |
| 2015/0029787 A1* | 1/2015 | Chen ..................... H01L 45/085 365/163 |
| 2015/0179437 A1* | 6/2015 | Li ....................... H01L 21/0217 438/792 |

OTHER PUBLICATIONS

Lee, F.M., A Novel Conducting Bridge Resistive Memory Using a Semiconducting Dynamic E-field Moderating Layer, VLSI Technology Digest of Technical Papers, 2013 Symposium on IEEE, 2013, pp. T104-T105, Macronix International Co. Ltd., Taiwan.

* cited by examiner

US 10,347,833 B2

RESISTIVE RANDOM ACCESS MEMORY AND FABRICATION METHOD THEREOF

CROSS-REFERENCES TO RELATED APPLICATIONS

This application claims the priority of Chinese patent application No. 201510631712.8, filed on Sep. 29, 2015, the entirety of which is incorporated herein by reference.

FIELD OF THE INVENTION

The present invention generally relates to the field of semiconductor manufacturing and, more particularly, relates to resistive random access memory and fabrication processes thereof.

BACKGROUND

Resistive random access memory (RRAM) has become a competitive candidate among the next-generation nonvolatile memory (NVM) technologies, and has been widely studied in recent years due to its excellent scalability, fast switching speed, simple device structure, long durability, multi-bit storage and 3D architecture potential, and good compatibility with the complementary logic technology, etc. The RRAM utilizes a material having a resistance switching characteristics between a top electrode and a bottom electrode to store data. The resistance switching material is an insulation material under a normal condition. However, when a voltage is applied to the resistance switching material, a conductive path is formed between the top electrode and the bottom electrode; and the resistance switching material becomes a conductive material.

The RRAM having the resistance switching medium based on amorphous silicon (a-Si) has become the most researched field of the RRAM due to its compatibility with the complementary logic technology. The existing fabrication method of a RRAM includes forming a bottom electrode (BE); forming a resistance switching layer made of amorphous silicon on the surface of the BE; and forming a top electrode (TE) on the surface of the resistance switching layer.

However, the performance of the RRAM formed by the existing fabrication methods may not be as desired. The disclosed device structures and methods are directed to solve one or more problems set forth above and other problems in the art.

BRIEF SUMMARY OF THE DISCLOSURE

One aspect of the present disclosure includes a fabrication method of a resistive random access memory. An exemplary fabrication method of the resistive random access memory includes providing a substrate; forming a bottom electrode on the substrate; forming a resistance switching layer on the substrate; forming a barrier on the resistance switching layer; and forming a top electrode on the barrier layer. The barrier layer is used to prevent atoms in the top electrode from diffusing into the resistance switching layer.

Another aspect of the present disclosure includes a resistive random access memory. The resistive random access memory includes a bottom electrode; a resistance switching layer formed on the bottom electrode; a barrier layer formed on the resistance switching layer; and a top electrode formed on the barrier layer. The barrier layer is used to prevent atoms in the top electrode from diffusing into the resistance switching layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
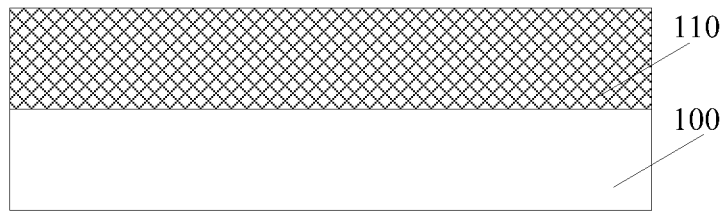
FIGS. 1-2 illustrate structures corresponding certain stages of an existing fabrication process of a RRAM.
Figure 2:
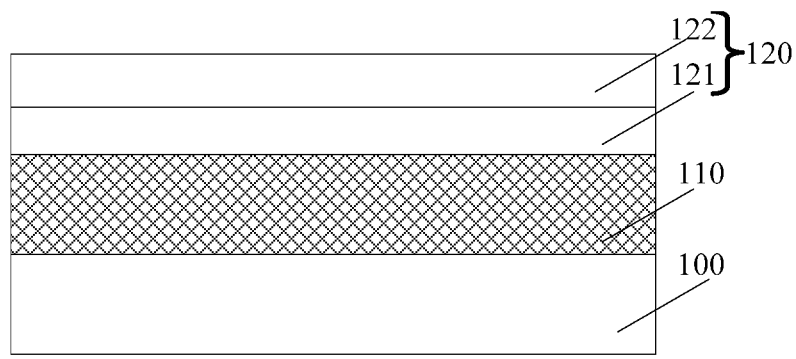

FIGS. 1-2 illustrate structures corresponding to certain stages of an existing fabrication method of a RRAM. As shown in FIG. 1, the method includes forming a bottom electrode (BE) 100; and forming a resistance switching layer 110 on the bottom electrode 100. The resistance switching layer 110 is made of amorphous silicon.

Further, as shown in FIG. 2, the method also includes forming a top electrode (TE) 120 on the resistance switching layer 110. The top electrode 120 includes an aluminum layer 121 and a titanium layer 122 formed on the aluminum layer 121.

Figure 3:
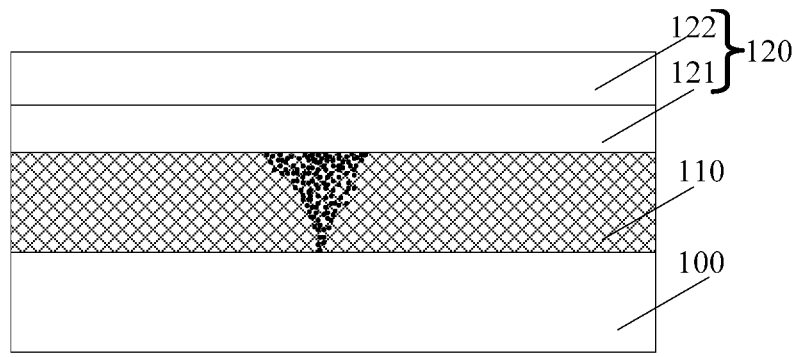
FIG. 3 illustrates an operation mechanism of a RRAM.

FIG. 3 illustrates the operation mechanism of the RRAM. As shown in FIG. 3, when a voltage is applied between the top electrode 120 and the bottom electrode layer 100, the electrons in the top electrode 120 flow to the bottom electrode 100 through the conductive path (the doted region) under the electric field between the top electrode 120 and the bottom electrode 100; and an electrical current is generated in the resistance switching layer 110. Under such a condition, the resistance switching layer 110 is at a low-resistance state; and the RRAM is at an "ON" status. When no voltage is applied between the top electrode 120 and the bottom electrode 100, the resistance switching layer 110 is at a high-resistance state; and the RRAM is at an "OFF" status.

Because the metal atoms in the top electrode 120 may easily diffuse into the resistance switching layer 110, the electron mobility of the top electrode 120 may be reduced. Further, if the metal atoms in the top electrode 120 diffuse into the resistance switching layer 110, when no voltage is applied, the insulation ability of the resistance switching layer 110 is reduced, and the switching ability of the resistance switching layer 110 is reduced as well.

Further, the resistance switching layer 110 is made of amorphous silicon; and the surface of the resistance switching layer 110 has non-saturated Si—H bonds. The outer shell of the atoms in the top electrode 120 has free electrons; and the atoms in the top electrode 120 present an electron-deficient status. Thus, the atoms in the top electrode 120 easily bond with the non-saturated Si—H bonds in the resistance switching layer 110. Such conditions adversely affect the crystallinity of the top electrode 120 at the region close to the interface between the top electrode 120 and the resistance switching layer 110. Thus, the electron mobility of the top electrode 120 is reduced. Accordingly, the performance of the RRAM may be reduced.

Figure 12:
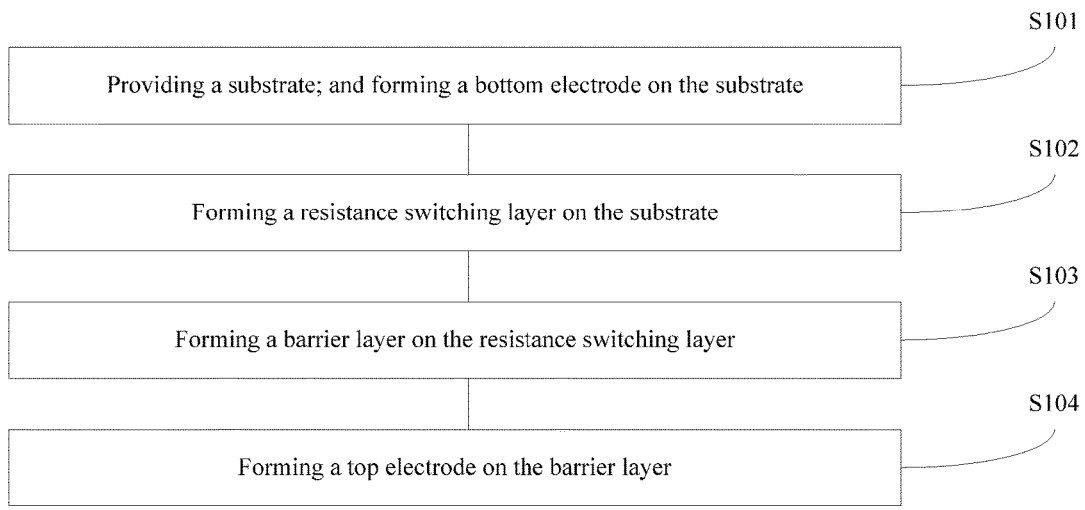
FIG. 12 illustrates an exemplary fabrication process of a RRAM consistent with the disclosed embodiments.

The present disclosure provides an improved fabrication process of a RRAM. FIG. 12 illustrates an exemplary fabrication process of a RRAM consistent with the disclosed embodiments. FIGS. 4-7 illustrate structures corresponding to certain stages of the exemplary fabrication process.

Figure 4:
FIGS. 4-7 illustrate structures corresponding to certain stages an exemplary fabrication process of a RRAM consistent with the disclosed embodiments.

As shown in FIG. 12, at the beginning of the fabrication process, a substrate is provided; and a bottom electrode is formed on the substrate (S101). FIG. 4 illustrates a corresponding structure.

As shown in FIG. 4, a substrate is provided (not shown); and a bottom electrode 210 is formed on the substrate. In one embodiment, the substrate may be a bottom metal interconnect layer, or a metal layer, such as M3, of a logic back end of line (BEOL) structure. The bottom metal interconnect layer may include a bottom dielectric layer; and a bottom metal layer penetrating through the bottom dielectric layer. The bottom electrode 210 may be electrically connected with the bottom metal layer. In certain other embodiments, the substrate may be other appropriate substrate with different devices and structures.

The bottom electrode 210 may be made of any appropriate metal, such as W, Al, Cu, Ni, Ti, Ta, or Mo, etc. The bottom electrode 210 may be also be made of metal nitride, such as TiN, etc. In one embodiment, the bottom electrode 210 is made of TiN.

Various processes may be used to form the bottom electrode 210, such as a physical vapor deposition (PVD) process, or an atomic layer deposition (ALD) process, etc. In one embodiment, the bottom electrode 210 is formed by a PVD process. In one embodiment, the thickness of the bottom electrode 210 is in a range of approximately 100 Å-500 Å.

Figure 5:
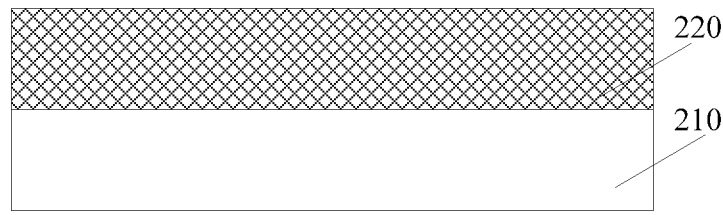

Returning to FIG. 12, after forming the bottom electrode 210, a resistance switching layer may be formed (S102). FIG. 5 illustrates a corresponding structure.

As shown in FIG. 5, a resistance switching layer 220 is formed on the bottom electrode 210. The resistance switching layer 220 may be made of any appropriate material. In one embodiment, the resistance switching layer 220 is made of amorphous silicon.

When the amorphous silicon is used to form the resistance switching layer 220, a top electrode may be subsequently formed on the resistance switching layer 220. When the voltage applied between the top electrode and the bottom electrode 210 is 0 V, the resistivity of the resistance switching layer 220 may be in a range of approximately $10^{-1}$ $\Omega\cdot m$-$10^{2}$ $\Omega\cdot m$. The resistance switching layer 220 may be at a high-resistance state; and the RRAM may be at an "OFF" status. When a voltage with a predetermined value is applied between the top electrode and the bottom electrode 210, the resistance switching layer 220 may be at a low-resistance state, and the RRAM may be at an "ON" status. In one embodiment, when the voltage that is subsequently applied on the bottom electrode 210 and the top electrode is in a range of approximately 1 V-10 V, the resistivity of the resistance switching layer 220 is in a range of approximately $10^{-4}$ $\Omega\cdot m$-$10^{-2}$ $\Omega\cdot m$. Further, in one embodiment, the thickness of the resistance switching layer 220 is in a range of approximately 30 Å-50 Å.

When the RRAM is at an "ON" status, to increase the conductive path of the resistance switching layer 220, and to reduce the voltage between the bottom electrode 210 and the top electrode; and to reduce the power consumption of the RRAM, the resistance switching layer 220 may be nanoparticles. The nanoparticles may be amorphous.

Various processes may be used to form the resistance switching layer 220, such as a plasma-enhanced chemical vapor deposition (PECVD) process, or a low-pressure chemical vapor deposition (LPCVD) process, etc. In one embodiment, the resistance switching layer 220 is formed by a PECVD process.

Figure 6:
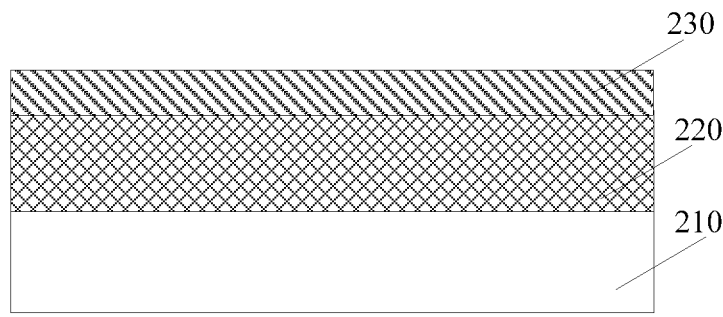

Returning to FIG. 12, after forming the resistance switching layer 220, a barrier layer may be formed (S103). FIG. 6 illustrates a corresponding structure.

As shown in FIG. 6, a barrier layer 230 is formed on the surface of the resistance switching layer 220. The barrier layer 230 may be also be referred to as a glue layer. The barrier layer 230 may be made of any appropriate material, such as silicon oxide, or silicon nitride, etc.

The thickness of the barrier layer 230 may be any appropriate value. If the barrier layer 230 is significantly thick, it may cause the required voltage applied between the bottom electrode 210 and the subsequently formed top electrode for switching the resistance switching layer 220 from the high-resistance state to the low-resistance stage to be significantly high; and the power consumption of the RRAM may be increased. If the thickness of the barrier layer 230 is substantially small, the barrier layer 230 may be unable to effectively prevent the metal atoms in the subsequently formed top electrode from diffusing into the resistance switching layer 220. Thus, in one embodiment, the thickness of the barrier layer 230 is in a range of approximately 10 Å-30 Å.

Various processes may be used to form the barrier layer 230, such as a PECVD process, a LPCVD process, or an ALD process, etc. In one embodiment, the barrier layer 230 is formed by a PECVD process.

Because the thickness of the barrier layer 230 may be relatively small, during the formation of the barrier layer 230, it may need to control the deposition rate of the barrier layer 230. If the deposition rate is significantly high, it may be unable to precisely control the thickness of the barrier layer 230; and the uniformity of the barrier layer 230 may be unacceptable. If the deposition rate of the barrier layer 230 is substantially low, the process efficiency may be relatively low. Thus, in one embodiment, the deposition rate of the barrier layer 230 may be in a range of approximately 2 Å/s-5 Å/s. Under such a condition, the PECVD process may be referred to a low deposition rate process; and the barrier layer 230 made of silicon nitride formed by the low rate deposition process may be referred to as a low deposition rate silicon nitride (LDRSIN) layer.

When the barrier layer 230 is made of silicon oxide, the gases of the PECVD process may include $SiH_4$, $N_2O$, $N_2$, and He, etc. $N_2$ and He may be the diluting gases; and $SiH_4$ and $N_2O$ may be the reaction gases. The flow rate of $SiH_4$ may be in a range of approximately 10 sccm-50 sccm. The flow rate of $N_2O$ may be in a range of approximately 20 sccm-100 sccm. The flow rate of $N_2$ may be in a range of approximately 10000 sccm-20000 sccm. The pressure of the reaction chamber may be in a range of approximately 2 Torr-5 Torr.

The temperature of the PECVD process may be any appropriate value. If the temperature of the PECVD process is significantly high, the deposition rate of the barrier layer 230 may be relatively high, it may be unable to precisely control the thickness of the barrier layer 230; and the barrier layer 230 may have cracks. If the temperature of the PECVD process is substantially low, the process efficiency may be reduced. Thus, in one embodiment, if the barrier layer is made of silicon oxide, the temperature of the PECVD process, i.e., the deposition temperature of the barrier layer 230, may be in a range of approximately 200° C.-400° C. When the barrier layer 230 is made of silicon nitride, the temperature of the PECVD process may be in a range of approximately 200° C.-400° C.

The PECVD process for forming the barrier layer 230 may utilize a high-frequency plasma to ionize the gases. If the power of the high-frequency plasma is substantially low, it may be unable to ionize the gases. If the power of the high-frequency plasma is significantly high, it may increase the fabrication cost and may be limited by the process conditions. In one embodiment, when the barrier layer 230 is made of silicon oxide or silicon nitride, the power of the high-frequency plasma is in a range of approximately 50 W-100 W.

The low-frequency power of the PECVD process for forming the barrier layer 230 may be used to generate a bias voltage. If the low-frequency power is substantially low, the quality of the formed barrier layer 230 may be unacceptable. If the low-frequency power is significantly high, it may generate severe damages to the barrier layer 230. Thus, in one embodiment, when the barrier layer 230 is made of silicon oxide or silicon nitride, the low-frequency power may be in a range of approximately 10 W-50 W.

Figure 7:
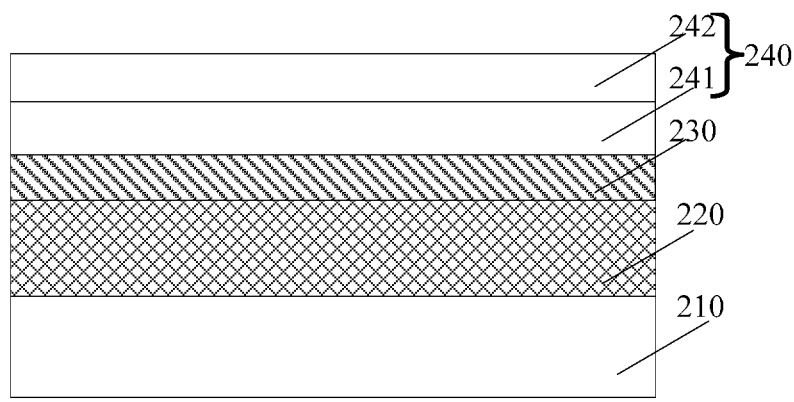

Returning to FIG. 12, after forming the barrier layer 230, a top electrode may be formed (S104). FIG. 7 illustrates a corresponding structure.

As shown in FIG. 7, a top electrode 240 is formed on the surface of the barrier layer 230. The top electrode 240 may be a single layer structure or a multiple-layer stacked structure.

In one embodiment, the top electrode 240 is a double-layer stacked structure. That is, the top electrode 240 may include a first top electrode 241 formed on the surface of the barrier layer 230, and a second top electrode 242 formed on the surface of the first top electrode 241.

The first top electrode 241 may be made of any appropriate metal material that has a good conductivity, such as Al, or Cu, etc. In one embodiment, the first top electrode 241 is made of Al.

The second top electrode 242 may be made of any appropriate metal material, such as W, Ti, or Mo, etc. The second top electrode 242 may also be made of a metal nitride, such as TiN, etc. In one embodiment, the second top electrode 242 is made of TiN.

Various processes may be used to form the first top electrode 241, such as a PVD process, a sputtering process, or an electroplating process, etc. Various processes may be used to form the second top electrode 242, such as a PVD process, a sputtering process, or an electroplating process, etc.

The top electrode 240 may be a double-layer stacked structure; and the resistivity of the first top electrode 241 may be lower than the resistivity of the second top electrode 242. Comparing with the top electrode 240 having only the second top electrode 242, the conductivity of the top electrode 240 having the double-layer structure may be improved.

Because it may be easy for the atoms in the first top electrode 241 to diffuse, especially when the first top electrode 241 is made of Al, Al atoms may be very easy to diffuse into adjacent other structures. However, because the barrier layer 230 may be formed on the resistance switching layer 220, the barrier layer 230 may be able to prevent the atoms in the first electrode 241 from diffusing into the resistance switching layer 220. Thus, it may avoid forming voids in the first top electrode 241; and the electron mobility of the first top electrode 241 may be increased; and the conductive properties of the top electrode 240 may be improved. Further, it may also avoid the atoms in the first top electrode 241 from entering into the resistance switching layer 220. Correspondingly, the reduction of the insulation ability of the resistance switching layer 220 when no voltage is applied between the bottom electrode 210 and the top electrode 240 may also be avoided. Accordingly, the switching performance of the resistance switching layer 220 may be improved.

The resistance switching layer 220 may be made of amorphous silicon, the surface of the resistance switching layer 220 may have non-saturated Si—H bonds. The electrons in the outer shells of the atoms of the first top electrode 240 may be free electrons; and the atoms in the first top electrode 241 may be at an electron-deficient status. If the first top electrode 241 is directly formed on the surface of the resistance switching layer 220, the atoms in the first top electrode 241 may be bonded with the non-saturated Si—H bonds on the surface of the resistance switching layer 220. Thus, the crystallinity of the first top electrode 241 at the regions close to the interface between first top electrode 241 and the resistance switching layer 220 may be unacceptable. In the present disclosure, the barrier layer 230 is formed between the resistance switching layer 220 and the first top electrode 241, it may affectively prevent the bonding process between the first top electrode 241 and the resistance switching layer 220. Thus, the first top electrode 241 may have a desired crystallinity near the interface between the first top electrode 241 and the resistance switching layer 220. Accordingly, the electron mobility of the first top electrode 241 may be increased; the conductivities of the first top electrode 241 may be increased; and the conductive performance of the top electrode 240 may be enhanced.

After forming the top electrode 240, top metal interconnect layers (not shown) may be formed on the top electrode 240. The top metal interconnect layer may be a metal layer, such as M4, of the static BEOL structure. That is, in one embodiment, the RRAM structure may be inserted between the M3 and the M4 of the static BEOL structure.

If a plurality of RRAMs are formed between the top metal interconnect layers and the bottom metal interconnect layer, interlayer dielectric layers may be formed among adjacent RRAMs. The RRAMs may provide switching on/off functions for memory devices.

Thus, a RRAM may be formed by the disclosed processes and methods. FIG. 7 illustrates a corresponding RRAM. As shown in FIG. 7, the RRAM may include a bottom electrode 210; and a resistance switching layer 220 formed on the bottom electrode 210. The resistance switching layer 220 may be made of amorphous silicon. Further, the RRAM may also include a barrier layer 230 formed on the surface of the resistance switching layer 220; and a top electrode 240 formed on the barrier layer 230. The detailed structures and intermediate structures are described above with respect to the fabrication processes.

The operation mechanism of the RRAM may include applying a voltage between the bottom electrode 210 and the top electrode 240. With the changing of the applied voltage, the resistance of the resistance switching layer 220 may be reversibly changed from a high-resistance state to a low-resistance state. The memory function of the RRAM may be achieved based on such resistance switching characteristics. When the voltage applied between the bottom electrode 210 and the top electrode 240 is 0 V, the resistivity of the resistance switching layer 220 may be in a range of approximately $10^{-1}$ Ω·m-$10^2$ Ω·m. The resistance switching layer 220 is at a high-resistance state; and the RRAM is at an "OFF" status. When the voltage applied between the bottom electrode 210 and the top electrode 240 is greater than a predetermined value, the electrons in the top electrode 240 may flow to the bottom electrode 210 under the electric field formed between the bottom electrode 210 and the top electrode 240 through the conductive path in the resistance switching layer 220. Thus, an electric current may be formed in the resistance switching layer 220. Under such a condition, the resistance switching layer 220 may be at a low-resistance state; and the RRAM at an "ON" status.

Figure 8:
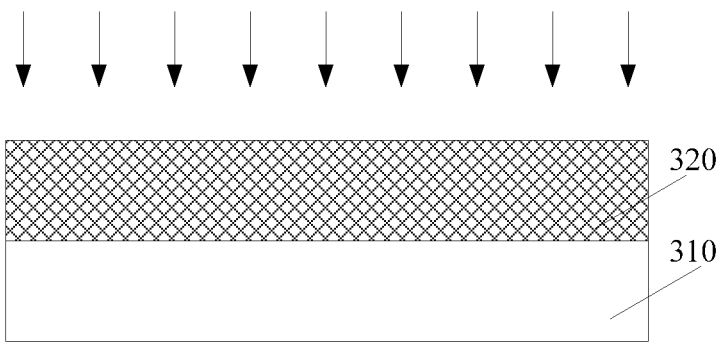
FIGS. 8-10 illustrate structures corresponding to certain stages another exemplary fabrication process of a RRAM consistent with the disclosed embodiments.
Figure 9:
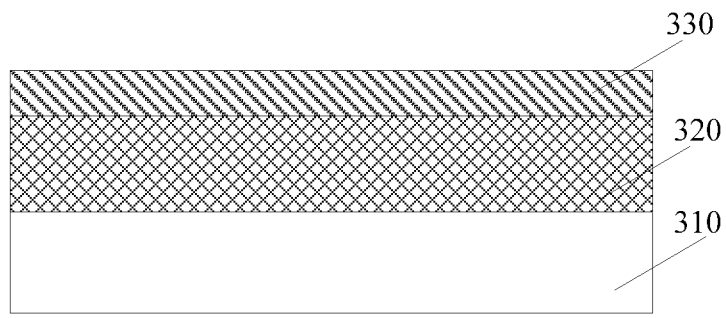
Figure 10:
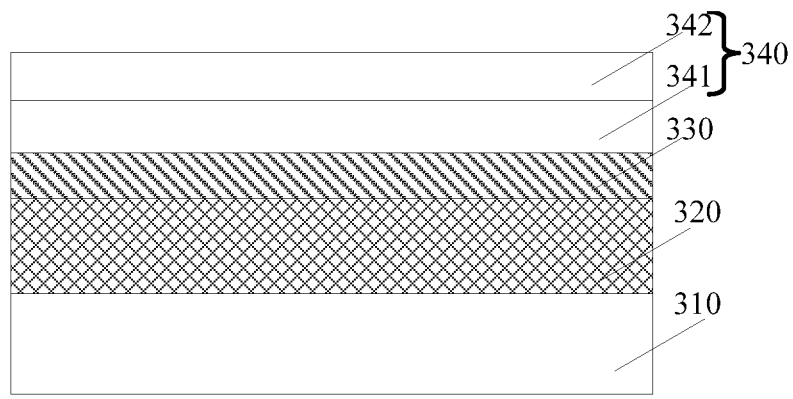
Figure 13:
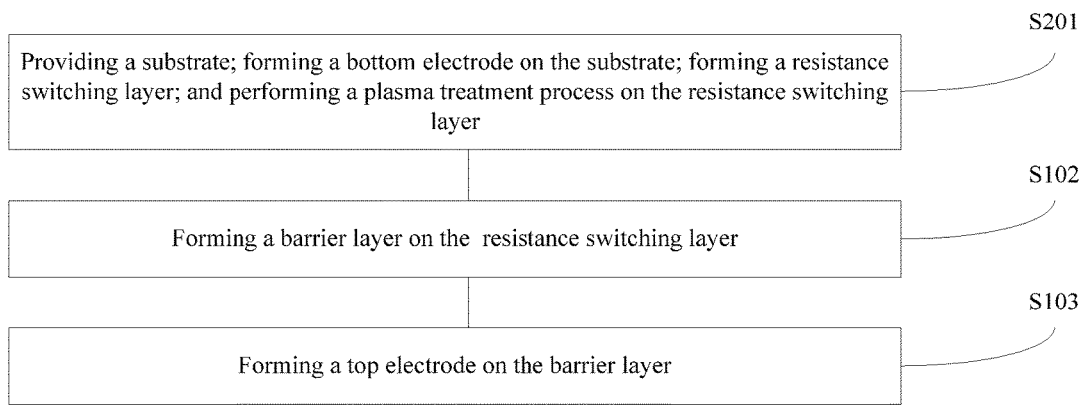
FIG. 13 illustrates another exemplary fabrication process of a RRAM consistent with the disclosed embodiments.

FIG. 13 illustrates another exemplary fabrication process of a RRAM consistent with the disclosed embodiments. FIGS. 8-10 illustrate structures corresponding to certain stages of the exemplary fabrication process.

As shown in FIG. 13, at the beginning of the fabrication process, a substrate is provided; and a bottom electrode and a resistance switching layer are formed on the substrate, and a plasma treatment process may be performed (S201). FIG. 8 illustrates a corresponding structure.

As shown in FIG. 8, a substrate is provided (not shown); and a bottom electrode 310 is formed on the substrate. Further, a resistance switching layer 320 may be formed on the surface of the bottom electrode 310. In one embodiment, the substrate may be a bottom metal interconnect layer. The bottom metal interconnect layer may include a bottom dielectric layer; and a bottom metal layer penetrating through the bottom dielectric layer. The bottom electrode 310 may be electrically connected with the bottom metal layer. In certain other embodiments, the substrate may be other appropriate substrate with different devices and structures.

The bottom electrode 310 may be made of any appropriate metal, such as W, Al, Cu, Ni, Ti, Ta, or Mo, etc. The bottom electrode 310 may also be made of metal nitride, such as TiN, etc. In one embodiment, the bottom electrode 310 is made of TiN.

Various processes may be used to form the bottom electrode 310, such as a PVD process, or an ALD process, etc. In one embodiment, the bottom electrode 310 is formed by a PVD process. In one embodiment, the thickness of the bottom electrode 310 is in a range of approximately 100 Å-500 Å.

The resistance switching layer 320 is made of amorphous silicon. When the amorphous silicon is used to form the resistance switching layer 320, a top electrode may be subsequently formed on the resistance switching layer 320. When the voltage applied between the top electrode and the bottom electrode 310 is 0 V, the resistivity of the resistance switching layer 320 is in a range of approximately $10^{-1}$ Ω·m-$10^2$ Ω·m. The resistance switching layer 320 is at a high-resistance state; and the RRAM is at an "OFF" status. When a voltage with a predetermined value is applied between the top electrode and the bottom electrode 310, the resistance switching layer 320 may be at a low-resistance state, and the RRAM may be at an "ON" status. In one embodiment, when the voltage that is subsequently applied on the bottom electrode 310 and the top electrode is in a range of approximately 1 V-10 V, the resistivity of the resistance switching layer 320 is in a range of approximately $10^{-4}$ Ω·m-$10^{-2}$ Ω·m. In one embodiment, the thickness of the resistance switching layer 320 is in a range of approximately 30 Å-50 Å.

When the RRAM is at an "ON" status, to increase the conductive path of the resistance switching layer 320, and to reduce the voltage between the bottom electrode 310 and the subsequently formed top electrode; and to reduce the power consumption of the RRAM, the resistance switching layer 320 may be nanoparticles. The nanoparticles may be amorphous.

Various processes may be used to form the resistance switching layer 320, such as a PECVD process, or an LPCVD process, etc. In one embodiment, the resistance switching layer 320 is formed by a PECVD process.

Referring to FIG. 8, after forming the resistance switching layer 320, a plasma treatment process (not labeled) may be performed on the surface of the resistance switching layer 320. During the plasma treatment process, the plasma may react with the residues, such as Si—$H_x$, etc., on the surface of the resistance switching layer 320 formed by the process for forming the resistance switching layer 320 to form by-product gases. The by-product gases may be vented from the reaction chamber of the plasma treatment process. Thus, the residues on the surface of the resistance switching layer 320 may be removed; and it may facilitate the subsequent formation of a barrier layer; and cause the barrier layer to have an uniform thickness.

Various gases may be used for the plasma treatment process. In one embodiment, $N_2$ is used for the plasma treatment process.

The flow rate of the gas in the plasma treatment process may be an appropriate value. If the flow rate is substantially low, the plasma density may be reduced; and the efficiency of the plasma treatment process may be reduced. If the flow rate of the gas in the plasma treatment process is significantly large, the production cost may be increased. In one embodiment, The total flow rate of the gases of the plasma treatment process may be in a range of approximately 100 sccm-1000 sccm.

The plasma treatment process may utilize a high-frequency plasma to ionize the gases. If the power of the high-frequency plasma is substantially low, it may be unable to ionize the gases. If the power of the high-frequency plasma is significantly high, it may increase the fabrication cost, and may be limited by the process conditions. In one embodiment, the power of the high-frequency plasma is in a range of approximately 100 W-1000 W, such as 100 W, 500 W, or 1000 W, etc.

The low-frequency power of the plasma treatment process may be used to generate a bias voltage. If the low-frequency power is substantially low, the momentum of the plasma may be substantially low; and it may be unable to break Si—$H_x$ bonds. Accordingly, it may adversely affect the reaction between the plasma and the residues on the surface of the resistance switching layer 320. If the low-frequency power is significantly high, the momentum of the plasma may be significantly high, and it may generate severe damages to the resistance switching layer 320. Thus, in one embodiment, the low-frequency power may be in a range of approximately 10 W-100 W, such as 10 W, 50 W, or 100 W.

The time of the plasma treatment process may be any appropriate value. If the time of the plasma treatment process is substantially short, the plasma may not have enough time to react with the residues on the surface of the resistance switching layer 320. If the time of the plasma treatment process is significantly long, the plasma may generate severe damages to the surface of the resistance switching layer 320. Thus, in one embodiment, the time of the plasma treatment process may be in a range of approximately 5 s-20 s.

In one embodiment, the pressure of the reaction chamber of the plasma treatment process may be in a range of approximately 1 Torr-10 Torr. The temperature of in the reaction chamber may be in a range of approximately 200° C.-400° C.

In one embodiment, the reaction chamber of the plasma treatment process may be a same reaction chamber with that of the process for forming the resistance switching layer 320. Thus, the process complexity may be simplified; and the process time may be shortened. In certain other embodiments, the plasma treatment process and the process for forming the resistance switching layer 320 may be performed in different reaction chambers.

Returning to FIG. 13, after performing the plasma treatment process, a barrier layer may be formed (S202). FIG. 9 illustrates a corresponding structure.

As shown in FIG. 9, a barrier layer 330 is formed on the treated surface of the resistance switching layer 320. In certain other embodiments, the barrier layer 330 may be referred to as a glue layer. The barrier layer 330 may be made of any appropriate material, such as silicon oxide, or silicon nitride, etc.

The thickness of the barrier layer 330 may be any appropriate value. If the barrier layer 330 is significantly thick, it may cause the required voltage applied between the bottom electrode 310 and the subsequently formed top electrode for switching the resistance switching layer 320 from the high-resistance state to the low-resistance stage to be significantly high; and the power consumption of the RRAM may be increased. If the thickness of the barrier layer 330 is substantially small, the barrier layer 330 may be unable to effectively prevent the metal atoms in the top electrode from diffusing into the resistance switching layer 320. Thus, in one embodiment, the thickness of the barrier layer 330 is in a range of approximately 10 Å-30 Å.

Various processes may be used to form the barrier layer 330, such as a PECVD process, a LPCVD process, or an ALD process, etc. In one embodiment, the barrier layer 330 is formed by a PECVD process.

Because the thickness of the barrier layer 203 may be relatively small, during the formation of the barrier layer 330, it may need to control the deposition rate of the barrier layer 330. If the deposition rate 330 is significantly high, it may be unable to precisely control the thickness of the barrier layer 330; and the uniformity of the barrier layer 330 may be unacceptable. If the deposition rate of the barrier layer 330 is substantially low, the process efficiency may be relatively low. Thus, in one embodiment, the deposition rate of the barrier layer 330 may be in a range of approximately 2 Å/s-5 Å/s. The barrier layer 330 made of silicon nitride formed by the PECVD process may be referred to as a LDRSIN layer.

When the barrier layer 330 is made of silicon oxide, the gases of the PECVD process may include $SiH_4$, $N_2O$, $N_2$, and He, etc. $N_2$ and He may be the diluting gases; and the $SiH_4$ and $N_2O$ may be the reaction gases. The flow rate of the $SiH_4$ may be in a range of approximately 10 sccm-50 sccm.

The flow rate of $N_2O$ may be in a range of approximately 20 sccm-100 sccm. The flow rate of $N_2$ may be in a range of approximately 10000 sccm-20000 sccm. The pressure of the reaction chamber may be in a range of approximately 2 Torr-5 Torr.

The temperature of the PECVD process may be any appropriate value. If the temperature of the PECVD process is significantly high, the deposition rate of the barrier layer 330 may be relatively high, it may be unable to precisely control the thickness of the barrier layer 330; and the barrier layer 330 may have cracks. If the temperature of the PECVD process is substantially low, the process efficiency may be reduced. Thus, in one embodiment, if the barrier layer 330 is made of silicon oxide, the temperature of the PECVD process, i.e., the deposition temperature of the barrier layer 330, may be in a range of approximately 200° C.-400° C. When the barrier layer 330 is made of silicon nitride, the temperature of the PECVD process may be in a range of approximately 200° C.-400° C.

The PECVD process for forming the barrier layer 330 may utilize a high-frequency plasma to ionize the gases. If the power of the high-frequency plasma is substantially low, it may be unable to ionize the gases. If the power of the high-frequency plasma is significantly high, it may increase the fabrication cost and may be limited by the process conditions. In one embodiment, when the barrier layer 330 is made of silicon oxide or silicon nitride, the power of the high-frequency plasma is in a range of approximately 50 W-100 W.

The low-frequency power of the PECVD process for forming the barrier layer 330 may be used to generate a bias voltage. If the low-frequency power is substantially low, the quality of the formed barrier layer 330 may be unacceptable. If the low-frequency power is significantly high, it may generate severe damages to the barrier layer 330. Thus, in one embodiment, when the barrier layer 330 is made of silicon oxide or silicon nitride, the low-frequency power may be in a range of approximately 10 W-50 W.

Returning to FIG. 13, after forming the barrier layer 330, a top electrode may be formed (S203). FIG. 10 illustrates a corresponding structure.

As shown in FIG. 10, a top electrode 340 is formed on the surface of the barrier layer 330. The top electrode 340 may be a single layer structure or a multiple-layer stacked structure.

In one embodiment, the top electrode 340 is a double-layer stacked structure. That is, the top electrode 340 may include a first top electrode 341 formed on the surface of the barrier layer 330 and a second top electrode 342 formed on the surface of the first top electrode 341.

The first top electrode 341 may be made of any appropriate metal material that has a good conductivity, such as Al, or Cu, etc. In one embodiment, the first top electrode 341 is made of Al.

The second top electrode 342 may be made of any appropriate metal material, such as W, Ti, or Mo, etc. The second top electrode 342 may also be made of metal nitride, such as TiN, etc. In one embodiment, the second top electrode 342 is made of TiN.

Various processes may be used to form the first top electrode 341, such as a PVD process, a sputtering process, or an electroplating process, etc. Various processes may be used to form the second top electrode 342, such as a PVD process, a sputtering process, or an electroplating process, etc.

The top electrode 340 may be a double-layer stacked structure; and the resistivity of the first top electrode 341 may be lower the resistivity of the second top electrode 342. Comparing with a top electrode having only the second top electrode 342, the conductivity of the top electrode 340 having the double-layer stacked structure may be improved.

Because it may be easy for the atoms in the first top electrode 341 to diffuse, especially when the first top electrode 341 is made of Al, Al atoms are very easy to diffuse into adjacent other structures. However, because the barrier layer 330 may be formed on the resistance switching layer 320, the barrier layer 330 may be able to prevent the atoms in the first electrode 341 from diffusing into the resistance switching layer 320. Thus, it may avoid forming voids in the first top electrode 341; and the electron mobility of the first top electrode 341 may be increased; and the conductive properties of the top electrode 340 may be improved. Further, it may also avoid the atoms in the first top electrode 341 from entering into the resistance switching layer 320. Correspondingly, the reduction of the insulation ability of the resistance switching layer 320 when no voltage is applied between the bottom electrode 310 and the top electrode 340 may also be avoided. Accordingly, the switching performance of the resistance switching layer 320 may be improved.

The resistance switching layer 320 may be made of amorphous silicon, the surface of the resistance switching layer 320 may have non-saturated Si—H bonds. The electrons in the outer shells of the atoms of in the first top electrode 341 may be free electrons; and the atoms in the first top electrode 341 may be at an electron-deficient status. If the first top electrode 341 is directly formed on the surface of the resistance switching layer 320, the atoms in the first top electrode 341 may be bonded with the non-saturated Si—H bonds on the surface of the resistance switching layer 320. Thus, the crystallinity of the top electrode 341 at the interface between first top electrode 341 and the resistance switching layer 320 may be unacceptable. In the present disclosure, the barrier layer 330 is formed between the resistance switching layer 320 and the first top electrode 341, it may be able to affectively prevent the bonding process between the first top electrode 341 and the resistance switching layer 320. Thus, the first top electrode 341 may have a desired crystallinity near the interface between the first top electrode 341 and the resistance switching layer 320. Accordingly, the electron mobility of the first top electrode 341 may be increased; the conductivities of the first top electrode 341 may be increased; and the conductive performance of the top electrode 340 may be enhanced.

After forming the top electrode 340, top metal interconnect layers (not shown) may be formed on the top electrode 340. The top interconnect layers may include the metal layer, such as M4, of a static BEOL structure. That is, in one embodiment, the RRAM may be inserted between the M3 and the M4 of the static BEOL structure. If a plurality of RRAMs are formed between the top metal interconnect layers and bottom metal interconnect layer, interlayer dielectric layers may be formed among adjacent RRAMs. The RRAM may be used to switch on/off memory devices.

Thus, an RRAM may be formed by the disclosed processes and methods. FIG. 8 illustrates a corresponding RRAM. As shown in FIG. 10, the RRAM may include a bottom electrode 310, and a resistance switching layer 320 formed on the bottom electrode 310. The resistance switching layer 320 may be made of amorphous silicon. The top surface of resistance switching layer 320 may be treated by plasma. Further, the RRAM may also include a barrier layer 330 formed on the treated surface of the resistance switching layer 320; and a top electrode 340 formed on the barrier layer 330. The detailed structures and intermediate structures are described above with respect to the fabrication processes.

Figure 11A:
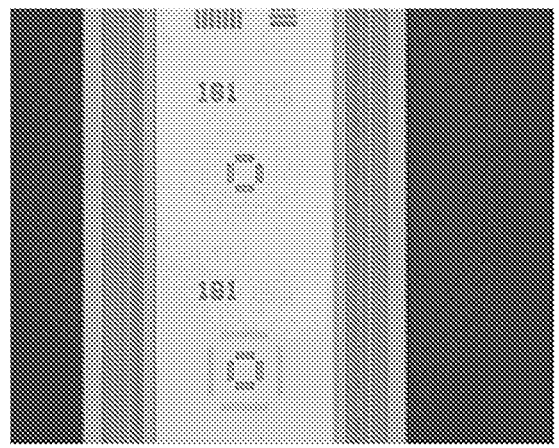
FIG. 11*a* is a scanning electron microscopy image of an exemplary RRAM consistent with the disclosed embodiments.
Figure 11B:
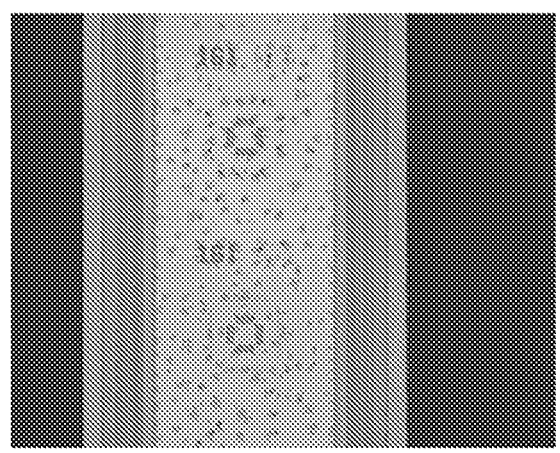
FIG. 11*b* is a scanning electron microscopy image of an existing RRAM.

FIG. 11a is a scanning electron microscopy (SEM) image of a RRAM formed by the disclosed methods; and FIG. 11b is a SEM image of a RRAM formed by the existing methods. During the imaging of the RRAMs, it may need to deposit a SiN layer to protect the top electrodes of the RRAM. The label "161" in FIG. 11a and FIG. 11b are position markers during the SEM imaging process.

As shown in FIG. 11a, the top electrode of the RRAM formed by the disclosed method may not have void defects. As shown in FIG. 11b, the top electrode of the RRAM formed by the existing methods shows a plurality of void defects. The void defects may adversely affect the conductivity of the top electrode.

Thus, according to the comparison between the RRAM formed by the disclosed method and the RRAM formed by the existing method, by forming a barrier layer, or a glue layer on the resistance switching layer, the void defects on the top electrode of the RRAM may be effectively prevented. Thus, the electron mobility of the top electrode of the disclosed RRAM may be increased; and the conductivity of the top electrode may be increased. Accordingly, the performance of the RRAM may be enhanced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a resistive random access memory, comprising:
   providing a substrate;
   forming a bottom electrode on the substrate;
   forming a resistance switching layer on the bottom electrode, the resistance switching layer including nanoparticles that are amorphous;
   after forming the resistance switching layer, performing a plasma treatment process on a surface of the resistance switching layer;
   forming a barrier layer on the resistance switching layer after performing the plasma treatment process on the surface of the resistance switching layer to cause the barrier layer to have a uniform thickness; and
   forming a top electrode on the barrier layer, the top electrode having a double-layer stacked structure,
   wherein the barrier layer is used to prevent atoms in the top electrode from diffusing into the resistance switching layer, and
   wherein forming the top electrode comprises:
   forming a first top electrode on the barrier layer; and
   forming a second top electrode made of a metal nitride covering the first top electrode made of a metal material, a resistivity of the first top electrode being lower than a resistivity of the second top electrode, wherein the first top electrode made of the metal material is sandwiched by the second top electrode made of a metal nitride and the barrier layer;
   wherein: the resistance switching layer is made of amorphous silicon;

wherein: the barrier layer is made of one of silicon oxide and silicon nitride; and wherein: a thickness of the barrier layer is in a range of approximately 10Å-30Å.

2. The method according to claim 1, wherein:
the barrier layer is formed by a plasma-enhanced vapor deposition (PECVD) process.

3. The method according to claim 2, when the barrier layer is made of silicon oxide, wherein:
gases of the PECVD process include $SiH_4$, $N_2O$, $N_2$, and He;
a flow rate of $SiH_4$ is in a range of approximately 10 sccm-50 sccm;
a flow rate of $N_2O$ is in range of approximately 20 sccm-100 sccm;
a flow rate of $N_2$ is in a range of approximately 10000 sccm-20000 sccm;
a flow rate of He is in a range of approximately 10000 sccm-20000 sccm;
a pressure of a reaction chamber of the PECVD process is in a range of approximately 2 Torr-5 Torr;
a high-frequency power is in a range of approximately 50 W-100 W;
a low-frequency power is in a range of approximately 10 W-50 W; and
a temperature of the PECVD process is in a range of approximately 200° C.-400° C.

4. The method according to claim 2, when the barrier layer is made of silicon nitride, wherein:
gases of the PECVD process include $SiH_4$, $NH_3$, and $N_2$;
a flow rate of $SiH_4$ is in a range of approximately 10 sccm-50 sccm;
a flow rate of $NH_3$ is in range of approximately 20 sccm-100 sccm;
a flow rate of $N_2$ is in a range of approximately 10000 sccm-20000 sccm;
a pressure of a reaction chamber of the PECVD process is in a range of approximately 2 Torr-5 Torr;
a high-frequency power is in a range of approximately 50 W-100 W;
a low-frequency power is in a range of approximately 10 W-50 W; and
a temperature of the PECVD process is in a range of approximately 200° C.-400° C.

5. The method according to claim 2, wherein:
a deposition rate of the barrier layer is in a range of approximately 2 Å/s-5 Å/s.

6. The method according to claim 1, wherein:
the first top electrode is made of Al; and
the second top electrode is made of TiN.

7. The method according to claim 1, wherein:
a thickness of the resistance switching layer is in a range of approximately 30Å-50Å.

8. The method according to claim 1, wherein
the barrier layer is configured to prevent a bonding process between the first top electrode and the resistance switching layer.

9. The method according to claim 1, wherein
the first top electrode having a desired crystallinity at the interface between the first top electrode and the resistance switching layer.

10. The method according to claim 1, wherein
a top interconnect layer is formed on the top electrode.

11. The method according to claim 10, wherein
the top interconnect layer is a metal layer, of a logic back end of line structure.

12. The method according to claim 1, wherein:
the first top electrode is made of Cu; and
the second top electrode is made of W, Ti, or Mo.

13. The method according to claim 1, wherein:
the barrier layer is formed by a low-pressure chemical vapor deposition process or an atomic layer deposition process.

14. The method according to claim 1, wherein:
the substrate is a bottom metal interconnect layer,
the bottom metal interconnect layer includes a bottom dielectric layer.

15. The method according to claim 1, wherein:
the barrier layer is sandwiched by the first top electrode and the resistance switching layer.

16. A method for fabricating a resistive random access memory, comprising:
providing a substrate;
forming a bottom electrode on the substrate;
forming a resistance switching layer on the bottom electrode;
after forming the resistance switching layer and before forming a barrier layer, performing a plasma treatment process on a surface of the resistance switching layer, wherein:
a gas of the plasma treatment process includes $N_2$;
a flow rate of the gas of the plasma treatment process is in a range of approximately 100 sccm-1000 sccm;
a high-frequency power of the plasma treatment process is in a range of approximately 100 W-1000 W;
a low-frequency power of the plasma treatment process is in a range of approximately 10 W-100 W;
a pressure of a reaction chamber of the plasma treatment process is in a range of approximately 1 Torr-10 Torr;
a temperature of the plasma treatment process is in a range of approximately 200° C.-400° C.; and
time of the plasma treatment process is in a range of approximately 5 s-20 s;
forming the barrier layer on the resistance switching layer; and
forming a top electrode on the barrier layer, the top electrode having a double-layer stacked structure,
wherein the barrier layer is used to prevent atoms in the top electrode from diffusing into the resistance switching layer, and
wherein forming the top electrode comprises:
forming a first top electrode on the barrier layer; and
forming a second top electrode on the first top electrode, a resistivity of the first top electrode being lower than a resistivity of the second top electrode.

* * * * *